(12) United States Patent
Chehade et al.

(10) Patent No.: US 12,389,567 B2
(45) Date of Patent: Aug. 12, 2025

(54) DATA CENTER RACK ASSEMBLY AND COOLING FLUID CONTROL METHOD WITH LEAK ALERT

(71) Applicant: OVH, Roubaix (FR)

(72) Inventors: Ali Chehade, Moncheaux (FR); Mohamad Hnayno, Roubaix (FR); Hadrien Bauduin, Villeneuve d'Ascq (FR); Henryk Klaba, Roubaix (FR)

(73) Assignee: OVH, Roubaix (FR)

( * ) Notice: Subject to any disclaimer, the term of this patent is extended or adjusted under 35 U.S.C. 154(b) by 469 days.

(21) Appl. No.: 17/889,972

(22) Filed: Aug. 17, 2022

(65) Prior Publication Data
US 2023/0062986 A1    Mar. 2, 2023

(30) Foreign Application Priority Data

Aug. 30, 2021  (EP) .................................... 21306176

(51) Int. Cl.
*H05K 7/20* (2006.01)
(52) U.S. Cl.
CPC ..... *H05K 7/20254* (2013.01); *H05K 7/20272* (2013.01); *H05K 7/20836* (2013.01)
(58) Field of Classification Search
None
See application file for complete search history.

(56) References Cited

U.S. PATENT DOCUMENTS

| | | |
|---|---|---|
| 6,462,949 B1 | 10/2002 | Parish, IV et al. |
| 7,522,418 B2 | 4/2009 | Ishimine |
| 7,599,184 B2 | 10/2009 | Upadhya et al. |
| 8,248,801 B2 | 8/2012 | Campbell et al. |
| 8,687,364 B2 | 4/2014 | Chainer et al. |
| 9,301,421 B2 | 3/2016 | French et al. |
| 10,448,543 B2 | 10/2019 | Farshchian et al. |

(Continued)

FOREIGN PATENT DOCUMENTS

WO    2012164261 A2    12/2012

OTHER PUBLICATIONS

English translation of Boudard et al. French Patent Publication No. 2900722, published 2007.*
Extended European Search Report with regard to the EP Patent Application No. 21306176.5 completed on Jan. 31, 2022.
Dr. Tim Shedd & Resul Altinkilic, "OCP Cooling—A Solution for Todays Data Centers", https://www.youtube.com/watch?v=7cOA9y70qrY accessed on Aug. 16, 2022, pdf 2 pages.

(Continued)

*Primary Examiner* — Bernard G Lindsay
(74) *Attorney, Agent, or Firm* — BCF LLP

(57) ABSTRACT

A rack assembly for a data center includes: a rack frame housing at least one heat-generating component; a heat exchanger defining a first internal fluid conduit; at least one liquid cooling block connected to the at least one heat-generating component, each of the at least one liquid cooling block defining a second internal fluid conduit, the second internal fluid conduit being in thermal connection with the first internal fluid conduit; a cooling loop independent from any sources of cooling fluid external to the rack assembly and comprising the first and second internal fluid conduits, the cooling loop transferring heat from the second internal fluid conduit to the first internal fluid conduit; and a fluid compensation system comprising a reservoir fluidly connected to the cooling loop and an actuating device to force cooling fluid from the reservoir to the cooling loop to compensate for loss of cooling fluid in the cooling loop.

18 Claims, 9 Drawing Sheets

(56) References Cited

U.S. PATENT DOCUMENTS

| | | | |
|---|---|---|---|
| 10,631,433 B2 | 4/2020 | Kaivo-Oja | |
| 11,249,522 B2 | 2/2022 | Kulkarni et al. | |
| 11,465,248 B1* | 10/2022 | Tsai | H01L 23/473 |
| 2011/0058637 A1* | 3/2011 | Campbell | F28D 15/00 |
| | | | 376/361 |
| 2012/0298335 A1* | 11/2012 | Eckberg | H05K 7/2079 |
| | | | 165/104.19 |
| 2012/0318368 A1* | 12/2012 | Doughty | G01M 3/3227 |
| | | | 137/12 |
| 2013/0333865 A1 | 12/2013 | Goth et al. | |
| 2015/0048950 A1 | 2/2015 | Zeighami et al. | |
| 2018/0004259 A1 | 1/2018 | Kulkarni et al. | |
| 2018/0027698 A1 | 1/2018 | Cader et al. | |
| 2019/0323749 A1 | 10/2019 | Toulouse et al. | |
| 2021/0092877 A1 | 3/2021 | Chen et al. | |
| 2021/0397145 A1* | 12/2021 | Sandhu | G05B 15/02 |

OTHER PUBLICATIONS

"Two Phase Rack Level Liquid Cooling Solution", Whitepapers, Nov. 2018, https://www.wiwynn.com/whitepapers/two-phase-rack-level-liquid-cooling-solution accessed on Aug. 16, 2022, pdf 7 pages.

"OCPUS 18—Two Phase Rack Level Cooling Solution", https://www.youtube.com/watch?v=ulwXomZmMM8 accessed on Aug. 16, 2022, pdf 2 pages.

"OCP Virtual Summit 2020: Standalone Rack Level Liquid Cooling Solutio", https://www.youtube.com/watch?v=6MjMglrJJi8 accessed on Aug. 16, 2022, pdf 2 pages.

EP Communication with regard to the EP Patent Application No. 21306176.5 issued on Apr. 2, 2024.

\* cited by examiner

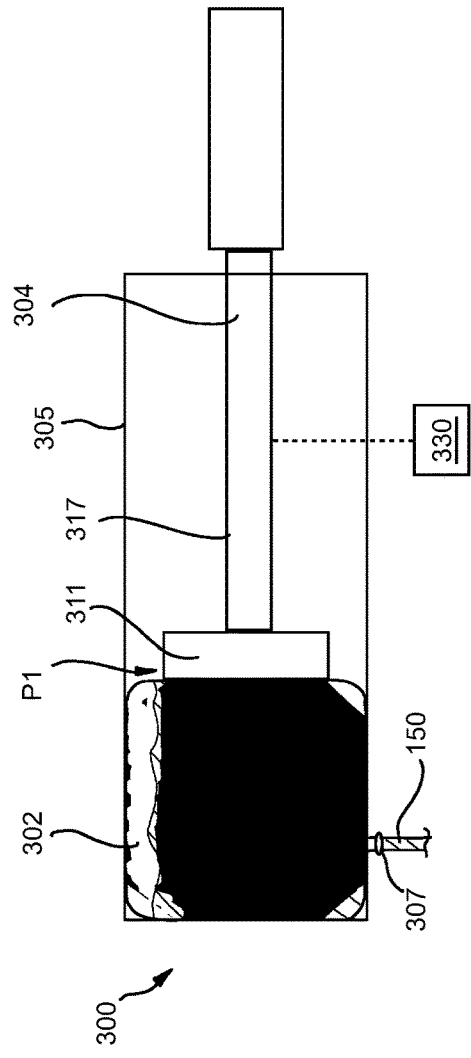 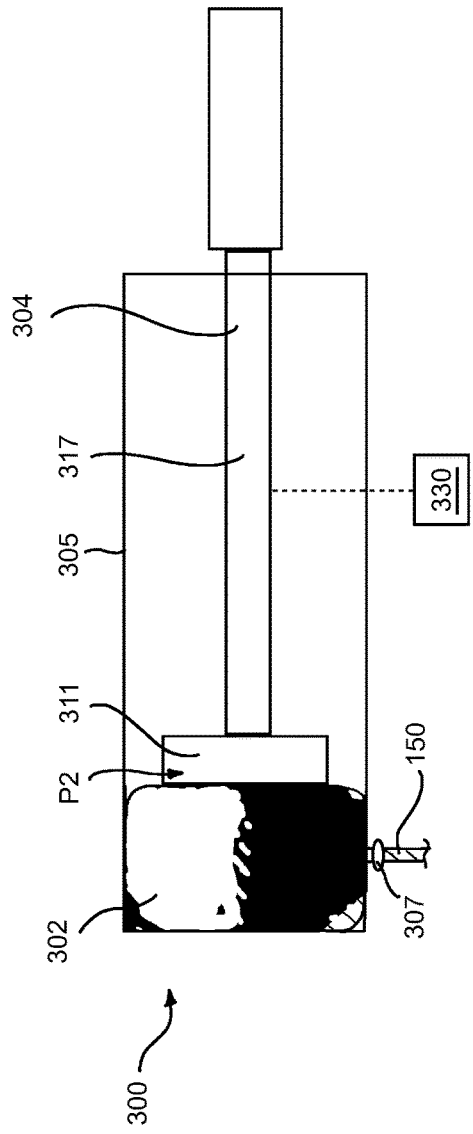
FIG. 7A
FIG. 7B

DATA CENTER RACK ASSEMBLY AND COOLING FLUID CONTROL METHOD WITH LEAK ALERT

REFERENCE TO RELATED APPLICATION

The present application claims priority to European Patent Application EP21306176.5, which was filed Aug. 30, 2021, the entirety of which is incorporated by reference herein.

FIELD OF TECHNOLOGY

The present technology relates to rack assemblies for data centers.

BACKGROUND

A data center houses many server racks that house electronic equipment such as computer systems (e.g., servers). In use, the electronic equipment generates a significant amount of heat that must be dissipated in order to ensure continued efficient operation of the electronic equipment. Many cooling solutions have been implemented to address this including the liquid cooling of heat-generating components (e.g., central processing units (CPUs)) by way of liquid cooling blocks mounted thereto (often referred to as water blocks or cold plates).

Although the liquid cooling blocks can efficiently cool heat-generating components, their implementation in server racks typically requires a liquid distribution system within the data center that can continuously provide cool liquid (e.g., water) to the various server racks within the data center. This can be prohibitively costly for many data center operators. In addition, often times, the implementation of liquid cooling blocks will also over time result in leaks within the network of conduits that feed the liquid cooling blocks. For example, leaks may occur during installation or removal of servers within the server racks. Such leaks can be particularly problematic if a source of cool liquid to the liquid cooling blocks is limited.

There is therefore a desire for a rack assembly for a data center which can alleviate at least some of these drawbacks.

SUMMARY

It is an object of the present technology to ameliorate at least some of the inconveniences present in the prior art.

According to one aspect of the present technology, there is provided a rack assembly for a data center. The rack assembly comprises: a rack frame defining at least one housing section and configured to house electronic equipment including at least one heat-generating component; a heat exchanger connected to the rack frame, the heat exchanger defining a first internal fluid conduit; at least one liquid cooling block connected to the at least one heat-generating component, each of the at least one liquid cooling block defining a second internal fluid conduit, the second internal fluid conduit being in thermal connection with the first internal fluid conduit of the heat exchanger; a cooling loop for circulating cooling fluid therein, the cooling loop being independent from any sources of cooling fluid external to the rack assembly, the cooling loop comprising the first and second internal fluid conduits, the cooling loop being configured to transfer heat from the second internal fluid conduit to the first internal fluid conduit; and a fluid compensation system comprising: a reservoir fluidly connected to the cooling loop, the reservoir being configured to contain cooling fluid therein; and an actuating device configured to force cooling fluid from the reservoir to the cooling loop to compensate for loss of cooling fluid in the cooling loop.

In some embodiments, the cooling loop fluidly connects the first internal fluid conduit to the second internal fluid conduit.

In some embodiments, the heat exchanger comprises: a cooling coil defining the first internal fluid conduit; and a plurality of fins connected to the cooling coil, the fins being positioned to allow air flow therebetween.

In some embodiments, the actuating device is an actuator, and the actuator is one of a mechanical actuator, an electric actuator, a pneumatic actuator and a hydraulic actuator.

In some embodiments, the fluid compensation system further comprises a controller in communication with the actuator to control actuation thereof, the controller being configured to control a load applied by the actuator on the cooling fluid in the reservoir.

In some embodiments, the controller controls the actuator such that the load applied by the actuator on the cooling fluid in the reservoir is generally constant.

In some embodiments, the fluid compensation system further comprises at least one of a flow rate sensor, a pressure sensor and a temperature sensor configured to sense, respectively, a flow rate, a pressure, and a temperature of the cooling fluid in the cooling loop; the controller is in communication with the at least one of the flow rate sensor, the pressure sensor and the temperature sensor to receive a sensor signal therefrom; and the controller controls the load applied by the actuator on the cooling fluid in the reservoir based on the sensor signal.

In some embodiments, the fluid compensation system further comprises: a sensor in communication configured to sense an operation parameter associated with the actuating device or the reservoir; and a controller in communication with the sensor, the sensor being operable to transmit a sensor signal to the controller indicative of the operation parameter, the controller being configured to transmit an alert signal based on the sensor signal received from the sensor, the alert signal being an indication of a leak in the cooling loop.

In some embodiments, the actuating device is an actuator, the sensor is a position sensor, and the operation parameter is a position of the actuator.

In some embodiments, the alert signal is configured to be transmitted to an external computer that monitors a status of the cooling loop of the rack assembly.

In some embodiments, a volume of the reservoir is greater than a volume of the cooling loop.

In some embodiments, the reservoir is a flexible reservoir; and the actuating device is configured to apply a load on the flexible reservoir in order to force cooling fluid from the flexible reservoir to the cooling loop.

In some embodiments, the reservoir is replaceable with a replacement reservoir when the reservoir is empty.

In some embodiments, the cooling loop comprises a bypass valve that is controllable to selectively allow cooling fluid in the cooling loop to bypass the first internal fluid conduit of the heat exchanger.

According to another aspect of the present technology, there is provided a method for controlling cooling fluid in a cooling loop of a rack assembly for a data center, the rack assembly comprising a heat exchanger connected to a rack frame of the rack assembly and at least one liquid cooling block thermally connected to one another, the heat exchanger comprising a first internal fluid conduit, the at least one liquid cooling block being connected to at least one heat-generating component housed within the rack frame, each of the at least one liquid cooling block defining a second internal fluid conduit, the cooling loop comprising the first internal fluid conduit of the heat exchanger and the second internal fluid conduit of each of the at least one liquid cooling block, the cooling loop being independent from any sources of cooling fluid external to the rack assembly, the method comprising: fluidly connecting a reservoir to the cooling loop, the reservoir containing cooling fluid therein; and forcing cooling fluid from the reservoir to the cooling loop to compensate for loss of cooling fluid in the cooling loop.

In some embodiments, forcing comprises actuating an actuator to force cooling fluid from the reservoir to the cooling loop, and the method further comprises sensing an operation parameter associated with the actuator or the reservoir; comparing the sensed operation parameter to a pre-determined threshold value of the operation parameter; and based on said comparing, notifying a user of a leak in the cooling loop.

In some embodiments, the operation parameter is a position of the actuator.

In some embodiments, the method further comprises in response to the reservoir being empty, replacing the reservoir with a replacement reservoir that contains cooling fluid.

According to yet another aspect of the present technology, there is provided a rack assembly for a data center. The rack assembly comprises a rack frame defining at least one housing section and configured to house electronic equipment including at least one heat-generating component, a heat exchanger connected to the rack frame, the heat exchanger defining a first internal fluid conduit, at least one liquid cooling block connected to the at least one heat-generating component, each of the at least one liquid cooling block defining a second internal fluid conduit, the second internal fluid conduit being in thermal connection with the first internal fluid conduit of the heat exchanger, a cooling loop for circulating cooling fluid therein, the cooling loop being independent from any sources of cooling fluid external to the rack assembly, the cooling loop comprising the first and second internal fluid conduits, the cooling loop being configured to transfer heat from the second internal fluid conduit to the first internal fluid conduit and a fluid compensation system. The fluid compensation system comprises a reservoir fluidly connected to the cooling loop, the reservoir being configured to contain cooling fluid therein and means for forcing cooling fluid from the reservoir to the cooling loop to compensate for loss of cooling fluid in the cooling loop.

Implementations of the present technology each have at least one of the above-mentioned objects and/or aspects, but do not necessarily have all of them. It should be understood that some aspects of the present technology that have resulted from attempting to attain the above-mentioned object may not satisfy this object and/or may satisfy other objects not specifically recited herein.

Additional and/or alternative features, aspects and advantages of implementations of the present technology will become apparent from the following description, the accompanying drawings and the appended claims.

BRIEF DESCRIPTION OF THE DRAWINGS

For a better understanding of the present technology, as well as other aspects and further features thereof, reference is made to the following description which is to be used in conjunction with the accompanying drawings, where:

FIG. 7A is a cross-sectional view of a reservoir and an actuator of a fluid compensation system of the rack assembly of FIG. 1, showing the reservoir in a full state;

FIG. 7B is a cross-sectional view of the reservoir and the actuator of FIG. 7B, showing the reservoir in a half-empty state;

DETAILED DESCRIPTION

Figure 1:
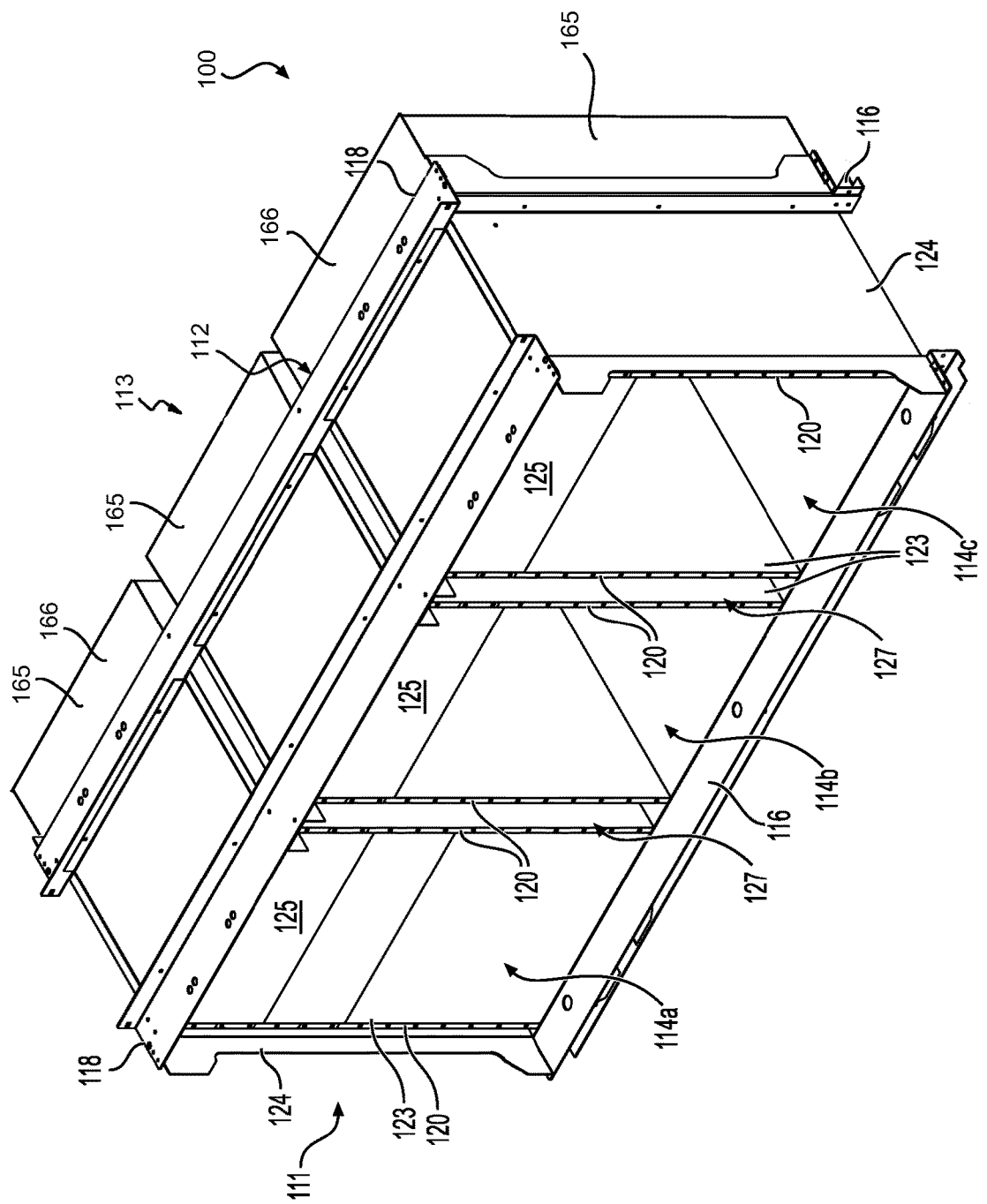
FIG. 1 is a perspective view, taken from a top, front, right side, of a rack assembly in accordance with an embodiment of the present technology.
Figure 2:
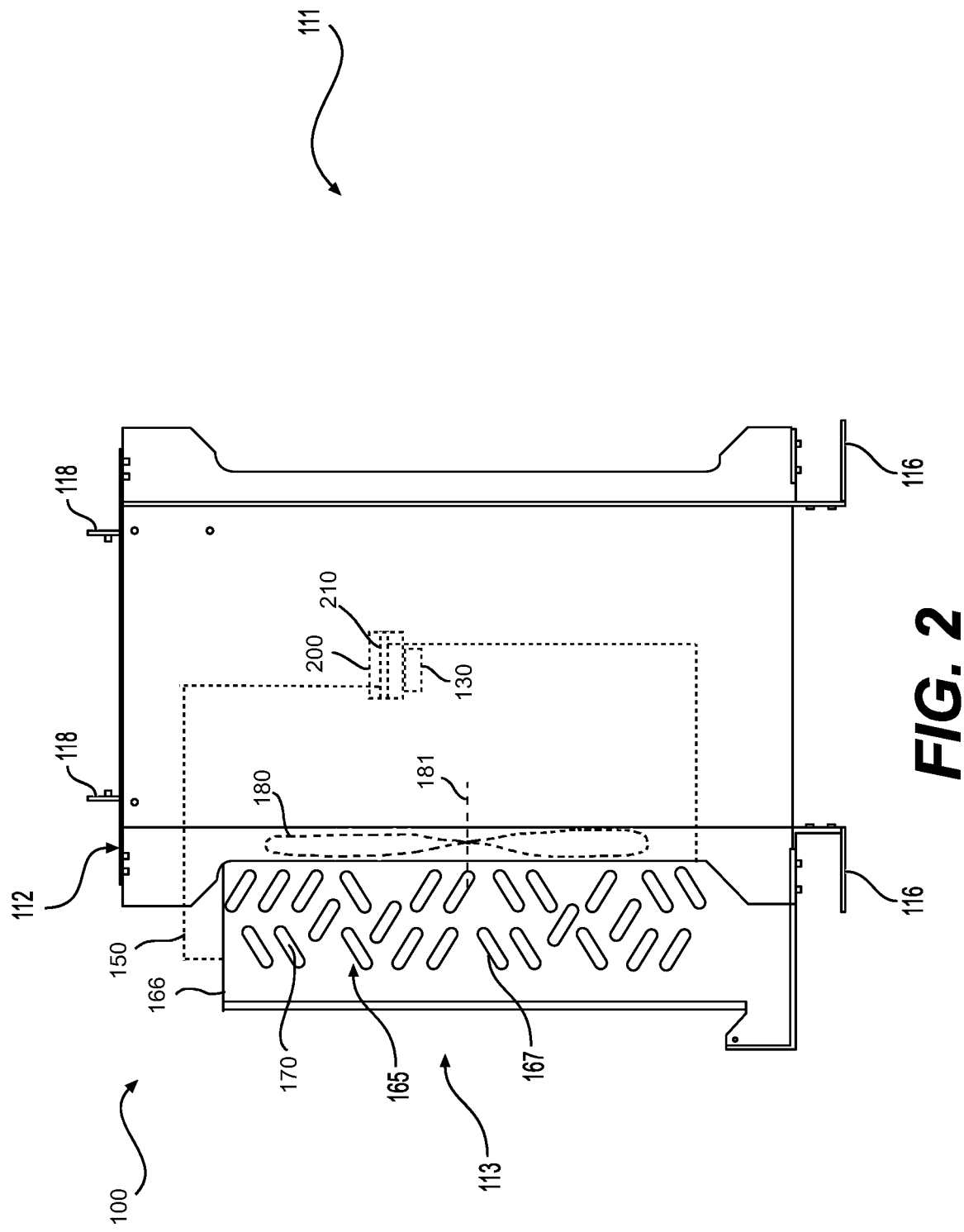
FIG. 2 is a left side elevation view of the rack assembly of FIG. 1.
Figure 3:
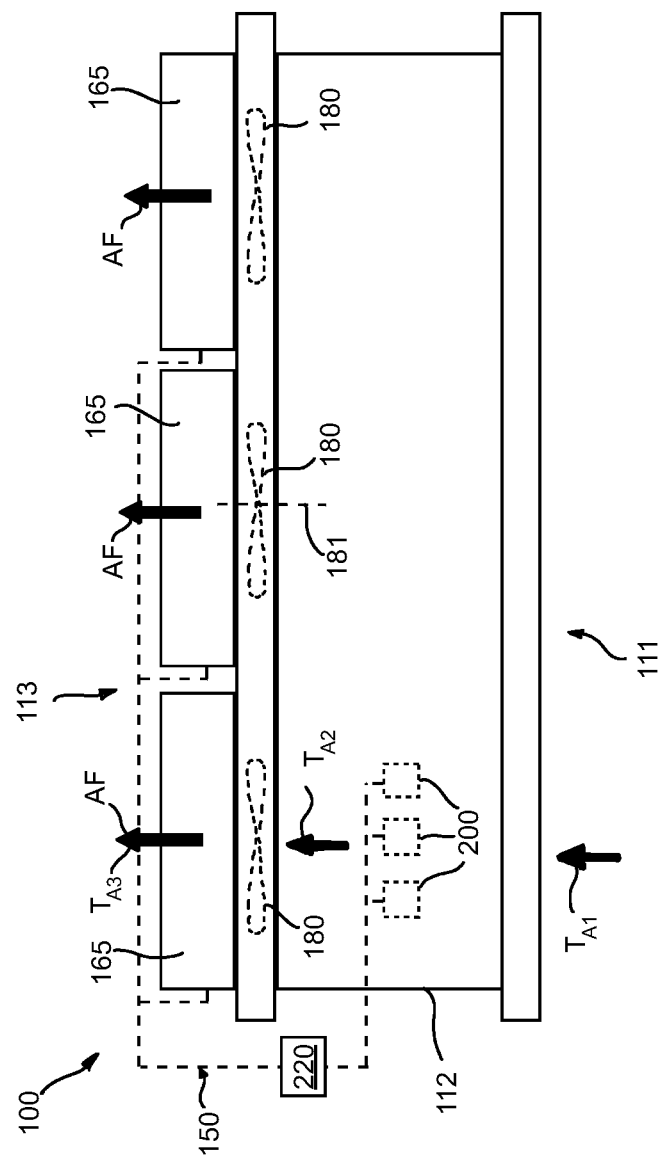
FIG. 3 is a top plan view of the rack assembly of FIG. 1.

FIGS. 1 to 3 illustrate a rack assembly 100 in accordance with an embodiment of the present technology. The rack assembly 100 is configured for use in a data center which, in use, houses multiple ones of the rack assembly 100. Notably, the rack assembly 100 is configured to house electronic equipment 125 such as servers, networking equipment, power equipment or any other suitable electronic equipment that is designed to support the function of the data center. In use, multiple such rack assemblies 100 are stacked in columns themselves and aligned in rows that are spaced from one another (forming aisles therebetween) and extend parallel to one another.

As illustrated schematically in FIG. 2, the rack assembly 100 has a cooling loop 150 that ensures cooling of the electronic equipment 125 housed by the rack assembly 100. Particularly, as is known, the electronic equipment 125 includes heat-generating components 130 (FIG. 2) that generate heat during use and therefore, if not properly cooled, can be subject to overheating. For instance, such heat-generating components 130 may include central processing units (CPUs), graphics processing units (GPUs), and other types of heat-generating electronic components. As will be explained in greater detail below, the rack assembly 100 is designed such that, if necessary, the cooling loop 150 can be independent from sources of cooling fluid external to the rack assembly 100. This may facilitate installing the rack assembly 100 in a data center and also reduces requirements of the facilities at which the rack assembly 100 can be installed. For instance, the rack assembly 100 may be more easily used in facilities in which an extensive piping system to route cooling fluid therein is not provided.

The general construction of the rack assembly 100 will now be described with reference to FIGS. 1 and 2. The rack assembly 100 has a rack frame 112 defining housing units 114a, 114b, 114c for housing electronic equipment 125 therein. The rack assembly 100 has a front side 111 through which the electronic equipment 125 can be inserted and removed from the rack assembly 110, and a rear side 113 opposite the front side 111. In order to dissipate heat generated by the electronic equipment 125, air generally enters the rack assembly 100 through the front side 111 and is discharged through the rear side 113. The front side 111 and the rear side 113 may thus be referred to as an air inlet side and an air outlet side respectively. The rack assembly 100 could include one or more heat exchangers 165 on the rear side 113 to manage heat emitted by the electronic equipment 125.

In this embodiment, the rack frame 112 has two elongated lower support members 116 and two elongated upper support members 118 disposed vertically above and parallel to the lower support members 116. The lower and upper support members 116, 118 define the width of the rack frame 112. Elongated vertical beams 120 are fastened (e.g., bolted or welded) to the lower support members 116 and the upper support members 118. Each of the housing units 114a, 114b, 114c is straddled, in the lateral direction of the rack assembly 100, by two of the vertical beams 120 such that the housing units 114a, 114b, 114c are arranged horizontally side-by-side. Thus, in this example of implementation, six vertical beams 120 are fastened to each of the lower support members 116 and the upper support members 118. Each vertical beam 120 is aligned, in the lateral direction of the rack assembly 100, with another vertical beam 120 that is affixed to an opposite lower support member 116. The vertical beams 120 define openings for affixing the rack-mountable electronic equipment 125 thereto.

Panels 123 are affixed to the vertical beams 120 and extend laterally between adjacent ones of the vertical beams 120 (i.e., between the vertical beams 120 that are adjacent to one another in the depth direction of the rack assembly 100) to define the housing units 114a, 114b, 114c therebetween. Channels 127 are formed between some of the panels 123 to accommodate cables and/or other components associated with operation of electronic equipment such as piping for conducting cooling fluid therein for cooling the electronic equipment. End panels 124 are fastened to the ends of each of the lower and upper support members 116, 118.

In this embodiment, the rack frame 112 is horizontally-extending in that a greatest dimension thereof is defined horizontally. Notably, a width of the rack frame 112, measured horizontally in a lateral direction of the rack 110, is greater than a height of the rack frame 112. The rack frame 112 may be configured differently in other embodiments.

Figure 4:
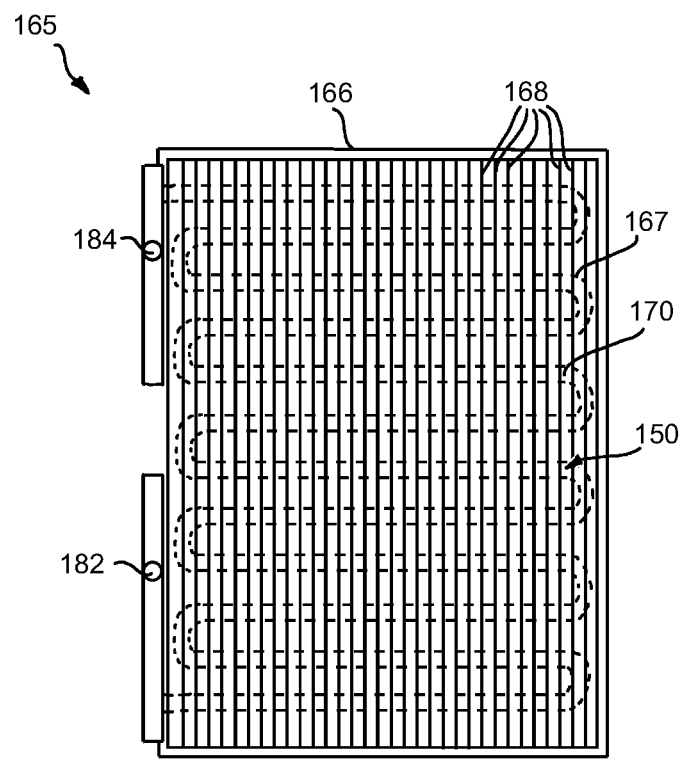
FIG. 4 is a rear elevation view of a heat exchanger of the rack assembly of FIG. 1.

As shown in FIGS. 1 to 3, the rack assembly 100 also includes three heat exchangers 165 configured to transfer heat with air flowing through the rack assembly 100. In this embodiment, as best shown in FIG. 4, the heat exchangers 165 are air-to-liquid heat exchangers such that each heat exchanger 165 has an exchanger frame 166, a cooling coil 167 connected to the exchanger frame 166 and a plurality of fins 168 connected to the cooling coil 167. The exchanger frame 166 is connected to the rack frame 112 and supports the components of the heat exchanger 165. For instance, the exchanger frame 166 may be connected to the rack frame 112 via hooks engaging the rack frame 112. In other embodiments, the exchanger frame 166 may be connected to the rack frame 112 by one or more hinges such that the exchanger frame 166, and therefore the heat exchanger 165, is pivotable about a hinge axis extending vertically. The cooling coil 167 is configured to circulate a cooling fluid therein. Notably, the cooling coil 167 defines an exchanger internal fluid conduit 170 which, as will be explained in more detail below, forms part of the cooling loop 150 of the rack assembly 100. The cooling coil 167 has an inlet 182 through which, in use, cooling fluid flows into the exchanger internal fluid conduit 170 and an outlet 184 through which, in use, cooling fluid is discharged from the exchanger internal fluid conduit 170. The fins 168 are configured to allow air flow therebetween such that air can flow through the heat exchanger 165 to exchange heat with the cooling fluid flowing in the cooling coil 167.

It is contemplated that more or fewer heat exchangers 165 may be provided in other embodiments. Furthermore, the heat exchangers 165 may be configured differently.

As shown in dashed lines in FIGS. 2 and 3, in this embodiment, the rack assembly 100 also includes a plurality of fans 180 for forcing air flow through the heat exchangers 165. The fans 180 are supported by the rack frame 112. For instance, in this embodiment, each fan 180 is connected to a support plate (not shown) that is connected to the rack frame 112 via hooks. In other embodiments, the support plate may be connected to the rack frame 112 via hinges (e.g., when the heat exchangers 165 are pivotably connected to the rack frame 112). In this embodiment, at least one fan 180 is configured to force air flow through a corresponding one of the heat exchangers 165. Each fan 180 is rotatable about a fan rotation axis 181 extending generally horizontally and more particularly in the front-to-rear direction of the rack assembly 100. As such, as shown in FIG. 3, the fans 180 force air flow through the respective heat exchangers 165 in the direction illustrated by air flow arrows AF. In use, the electronic equipment 125 can lack its own fans, such that the fans 180 also force air through the electronic equipment 125.

Figure 5:
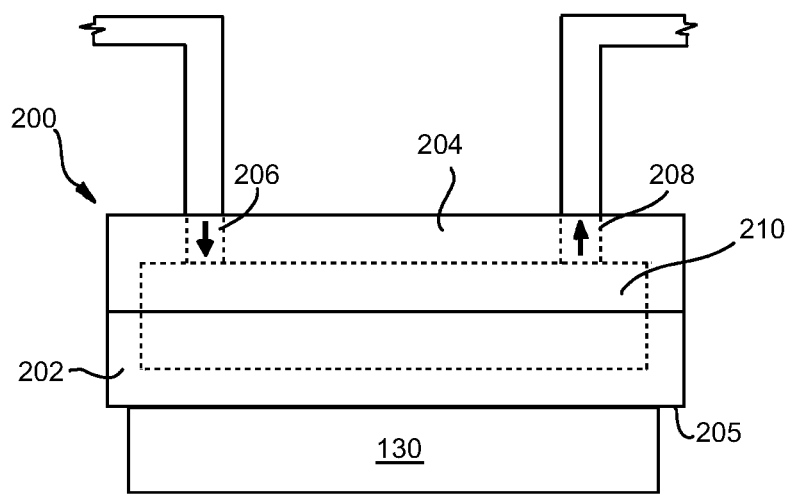
FIG. 5 is a front elevation view of a liquid cooling block of the rack assembly of FIG. 1.

With reference to FIGS. 2 and 3, the rack assembly 100 also includes a plurality of liquid cooling blocks 200 for cooling respective ones of the heat-generating components 130 of the electronic equipment 125 housed within the housing sections 114a, 114b, 114c. Notably, as shown in FIG. 5, each liquid cooling block 200 is mounted to a corresponding one of the heat-generating components 130 to absorb heat therefrom. The liquid cooling blocks 200 are also commonly referred to as "water blocks" or "cold plates". In this embodiment, each of the liquid cooling blocks 200 is configured identically and thus a single one of the liquid cooling blocks 200 will be described herein.

With reference to FIG. 5, in this embodiment, the liquid cooling block 200 has a base portion 202 and a cover portion 204 connected to the base portion 202. The base portion 202 has a thermal transfer surface 205 on an underside thereof. In use, the thermal transfer surface 205 is placed in thermal contact with a corresponding heat-generating component 130 to absorb heat therefrom. Together, the base portion 202 and the cover portion 204 define a block internal fluid conduit 210 of the liquid cooling block 200. The block internal fluid conduit 210 forms part of the cooling loop 150 of the rack assembly 100. The liquid cooling block 200 has an inlet 206 through which cooling fluid flows into the block internal liquid conduit 210 and an outlet 208 through which cooling fluid is discharged out of the block internal liquid conduit 210 (as illustrated by the arrows in FIG. 5). A more detailed description of an example of the liquid cooling block can be found in European Patent Application 18315027.5, filed Sep. 4, 2018, the entirety of which is incorporated by reference herein. The liquid cooling block 200 could be configured differently in other embodiments.

The cooling loop 150 thermally connects the block internal fluid conduits 210 of the liquid cooling blocks 200 to the exchanger internal fluid conduits 170 of the heat exchangers 165. In particular, in the cooling loop 150, heat is transferred from the cooling fluid flowing in the block internal fluid conduits 210 to the cooling fluid flowing in the exchanger internal fluid conduits 170. More specifically yet, in this embodiment, with reference to FIG. 6, the cooling loop 150 fluidly connects the block internal fluid conduits 210 to the exchanger internal fluid conduits 170. As such, the cooling fluid flowing in the cooling loop 150 sequentially flows in the block internal fluid conduits 210 and the exchanger internal fluid conduits 170 in a looping manner. In this embodiment, the cooling fluid flowing through the cooling loop 150 is water. However, it is contemplated that the cooling fluid could be any other suitable type of cooling fluid (e.g., a refrigerant, a two-phase dielectric solution, or others). In other embodiments where the cooling fluid is a two-phase cooling fluid, the cooling blocks 200 act like evaporators, the fluid entering the inlets 206 in liquid phase while exiting the outlets 208 totally or partially in vapour phase, and the heat exchangers 165 act like condensers returning the fluid to a liquid phase before it exits the outlets 184.

In order to promote the circulation of the cooling fluid within the cooling loop 150, the cooling loop 150 of the rack assembly 100 includes a pump 220 which, in this embodiment, is disposed downstream of the liquid cooling blocks 200 and upstream of the heat exchangers 165. It is contemplated that additional pumps 220 may be provided in other embodiments. Moreover, the pump 220 may be disposed at a different location within the cooling loop 150. For instance, in embodiments where the cooling fluid is a two-phase cooling fluid, the pump 220 is installed downstream of the heat exchangers 165 and upstream the cooling blocks 200 such that the pumps 220 interact with the cooling fluid in its liquid phase. The pump 220 draws heated cooling fluid at a temperature $T_{L1}$ from the liquid cooling blocks 200 and pumps it to the heat exchangers 165 where the heat from the cooling fluid is transferred to the air that flows through the heat exchangers 165. As such, as the cooling fluid is discharged from the heat exchangers 165 within the cooling loop 150, the cooling fluid has a temperature $T_{L2}$ lower than the temperature $T_{L1}$. For instance, in a non-limiting example, the temperature $T_{L1}$ may be approximately 40° C. while the temperature $T_{L2}$ is approximately 35° C.

As such, referring to FIG. 3, the temperature of the air flowing through the rack assembly 100 gets progressively hotter as the air traverses the rack assembly 100. Notably, the air as it enters the rack assembly 100 has a temperature $T_{A1}$ that, in a non-limiting example, may be approximately 26° C. After the air flows into the rack frame 112 and absorbs heat from the electronic equipment 125 stored within the rack frame 112, the temperature of the air increases to a temperature $T_{A2}$. For instance, in a non-limiting example, the temperature $T_{A2}$ may be approximately 30° C. Finally, as the air is discharged through the heat exchangers 165 having absorbed heat from the cooling fluid flowing in the exchanger internal fluid conduits 170, the air has a temperature $T_{A3}$ that is the highest temperature of the air in its flow through the rack assembly 100. For instance, in a non-limiting example, the temperature $T_{A3}$ may be approximately 37° C. An air conditioning system within the data center may then introduce cool air into the data center to reduce the air temperature therein which has been increased by air discharged by the rack assembly 100. Therefore, as will be appreciated, the cooling loop 150, which is independent of any sources of cooling fluid external to the rack assembly 100, may facilitate the use of the rack assembly 100 in facilities that are not equipped to continuously provide cooled water (or other cooling fluid) to the rack assembly 100. For instance, this may be useful in colocated data centers (where a company may own only one or a few rack assemblies therein) in which such cooled water provision is not guaranteed but adequate air conditioning is provided.

It is to be understood that the temperature of the cooling fluid as it circulates within the cooling loop 150 can be affected by an operation configuration of the heat exchangers 165. For instance, in this embodiment, the heat exchangers 165 operate in a counter-current flow configuration, which is generally preferred when the goal is to maximize heat transfer capacity and to lower the temperatures of the cooling fluid circulating in the cooling loop 150, namely as this configuration allows the temperature $T_{L2}$ range between $T_{A2}$ and $T_{A3}$. In other embodiments, the heat exchangers 165 can operate in a co-current flow configuration, at the expense of higher temperatures of the cooling fluid circulating in the cooling loop 150 as the temperature $T_{L2}$ is by principle higher than the temperature $T_{A3}$. Therefore, it may be preferable to operate the heat exchangers 165 in co-current flow configuration when the cooling fluid is a two-phase cooling fluid and the heat exchangers 165 act like condensers, as it could ease the choice of the two-phase cooling fluid regarding its boiling point, and ensures vaporization occurs in the cooling blocks 200.

Furthermore, as will appreciated, the temperature of the cooling fluid as it circulates within the cooling loop 150 will also be affected by the flow rate of the cooling fluid within the cooling loop 150 as well as the flow rate of air through the rack assembly 100.

Figure 6:
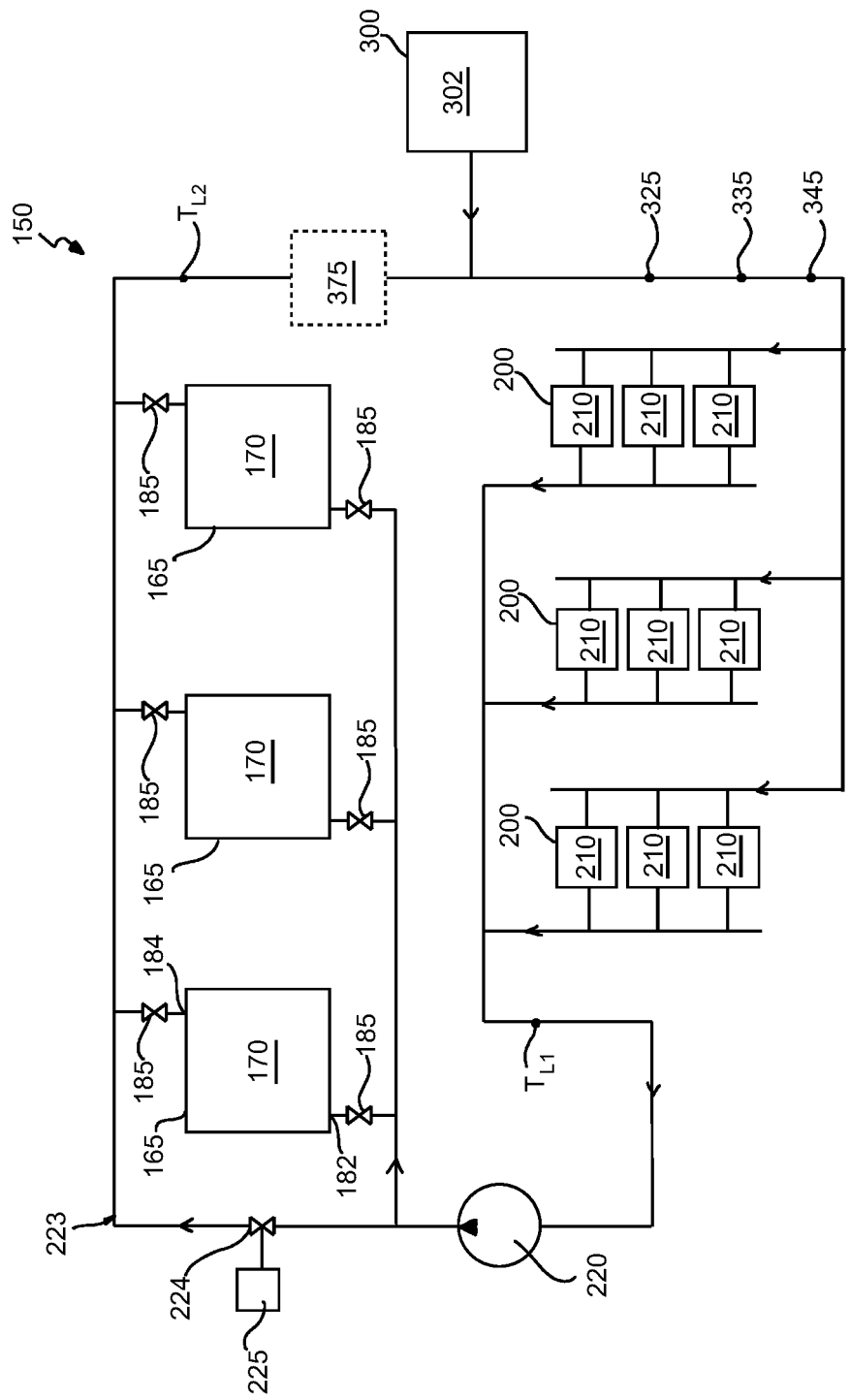
FIG. 6 is a schematic representation of a cooling loop of the rack assembly of FIG. 1.

As shown in FIG. 6, the cooling loop 150 may also optionally include a bypass valve 224 that is controlled to selectively allow the cooling fluid in the cooling loop 150 to bypass the exchanger internal fluid conduits 170 of the heat exchangers 165. Notably, when the bypass valve 224 opens, at least some part of the cooling fluid flowing through the cooling loop 150 flows into the bypass section 223, thereby avoiding flowing into the heat exchangers 165. This may be useful for example if the temperature of the ambient air within the data center (i.e., the temperature $T_{A1}$) that enters the rack assembly 100 reaches an excessive value that would not result in cooling the cooling fluid in the heat exchangers 165. The bypass valve 224 may close again once the situation is rectified (i.e., the temperature $T_{A1}$ is no longer considered excessive). In this embodiment, the opening and closing of the bypass valve 224 is based on a temperature signal sensed by a temperature sensor 225 (FIG. 6). Notably, if the temperature sensor 225 senses a temperature above a given pre-determined temperature threshold, a controller in communication with the bypass valve 224 could actuate the bypass valve 224 to its open position. Once the temperature sensed by the temperature sensor 225 reaches a value equal to or less than the pre-determined temperature threshold, the controller actuates the bypass valve 224 back to its closed position.

In addition, with continued reference to FIG. 6, the cooling loop 150 includes isolating valves 185 disposed near the inlets 182 and the outlets 184 of the heat exchangers 165. Notably, as can be seen, an isolating valve 185 is disposed upstream of a corresponding inlet 182 while another isolating valve 185 is disposed downstream of the corresponding outlet 184. The isolating valves 185 may be controlled to operate in reverse directions to the bypass valve 224. More specifically, when the bypass valve 224 is in its open position to direct cooling fluid flow through the bypass section 223, the isolating valves 185 are closed to impede flow into the internal fluid conduits 170. On the other hand, when the bypass valve 224 is closed, the isolating valves 185 are open to allow flow into the internal fluid conduits 170. It is contemplated that only the isolating valves 185 at the inlets 182 may be controlled, or that only the isolating valve 185 at the outlets 184 may be controlled in other embodiments.

Furthermore, as shown in FIG. 6, the cooling loop 150 may also optionally include an internal heat exchanger 375 configured to cool the cooling fluid in the cooling loop 150. Notably, the internal heat exchanger 375 defines an internal chamber (not shown) that is thermally connected to (but fluidly disconnected from) the cooling loop 150 in order to transfer heat from the cooling fluid in the cooling loop 150 to a substance contained in the internal chamber of the internal heat exchanger 375. In particular, in this embodiment, the internal heat exchanger 375 contains a phase-change material which absorbs energy at phase transition thereof to cool the cooling fluid in the cooling loop 150. Thus, the internal heat exchanger 375 may be useful to collaborate with the bypass valve 224 such that, when ambient air is too hot, the internal heat exchanger 375 ensures continued cooling of the cooling fluid in the cooling loop 150. The internal heat exchanger 375 may be implemented differently in other embodiments.

Referring now to FIGS. 6 to 7B, the rack assembly 100 also has a fluid compensation system 300 configured to compensate for losses of cooling fluid within the cooling loop 150. Notably, as shown in FIG. 7A, the fluid compensation system 300 includes a reservoir 302 that is fluidly connected to the cooling loop 150, and an actuating device 304 that, in use, forces cooling fluid from the reservoir 302 to the cooling loop 150 to compensate for loss of cooling fluid in the cooling loop 150. In particular, the reservoir 302 has a reservoir outlet 307 that fluidly connects the reservoir 302 to the cooling loop 150. The reservoir 302 contains the same type of cooling fluid therein as is contained within the cooling loop 150 (i.e., water in this embodiment). In this embodiment, the actuating device 304 is an actuator 304 having a shaft 317 and an end portion 311 connected to the shaft 317 at an end thereof. The end portion 311 of the actuator 304 exerts pressure on the cooling fluid of the reservoir 302 to force the cooling fluid into the cooling loop 150 when the cooling loop 150 requires compensation for a loss of cooling fluid.

In this embodiment, the reservoir 302 is a flexible reservoir such as a pouch made of plastic, rubber, or a composite material, and is configured to be compressed by the actuator 304 to force the cooling fluid contained by the reservoir 302 into the cooling loop 150. For instance, in this example, as shown in FIG. 7A, the reservoir 302 is disposed within a housing 305 together with the end portion 311 of the actuator 304 which is in contact with the reservoir 302 to apply a load thereon to force the cooling fluid into the cooling loop 150. The implementation of the reservoir 302 as a flexible reservoir may facilitate maintenance operations, namely once the reservoir 302 is empty. Notably, in this embodiment, the reservoir 302 is replaceable with a replacement reservoir (filled with cooling fluid) once the reservoir 302 is empty. For example, the reservoir 302 can be disconnected from the cooling loop 150 and the replacement reservoir is installed in its place and normal operation of the cooling fluid compensation system 300 can resume.

In this embodiment, the reservoir 302 has a volume that is greater than a volume of the cooling loop 150. In other words, the amount of cooling fluid contained within the reservoir 302 when the reservoir 302 is full is greater than the amount of cooling fluid contained within the entire cooling loop 150. As such, the reservoir 302 may be used to fill the cooling loop 150 and subsequently to compensate losses of cooling fluid from the cooling loop 150. That is, at installation, the reservoir 302 in its full state (i.e., filled to its maximum) can be fluidly connected to the cooling loop 150 when the cooling loop 150 is still empty in order to fill the cooling loop 150 with cooling fluid. Since the volume of the reservoir 302 is greater than that of the cooling loop 150, a certain volume of cooling fluid would remain in the reservoir 302 which can then be used to compensate for losses of cooling fluid in the cooling loop 150.

It is contemplated that, in some embodiments, the reservoir 302 may not be a flexible reservoir and may instead consist of a volume of the cooling fluid housed in a rigid housing and under pressure exerted by the actuator 304.

In this embodiment, the actuator 304 applies a generally constant load on the reservoir 302. When the cooling loop 150 is full (i.e., has had no leaks), the pressure within the reservoir 302 is the same as the pressure within the cooling loop 150 at a connection point between the reservoir 302 and the cooling loop 150. However, when there is a leak in the cooling loop 150 (i.e., a loss of cooling fluid therein), the pressure within the reservoir 302 as sustained by the actuator 304 becomes greater than the pressure within the cooling loop 150 and thus some quantity of cooling fluid flows from the reservoir 302 into the cooling loop 150 to compensate for the equivalent quantity of cooling fluid that had leaked from the cooling loop 150.

In this embodiment, the actuator 304 is an electric actuator that is powered electrically. Notably, in use, a controller is in communication with the actuator 304 to control the load applied by the actuator 304 on the reservoir 302. For instance, the controller 310 controls the actuator 304 such that the actuator 304 applies a constant load on the reservoir 302.

In other embodiments, the controller may control the actuator 304 such that the load applied by the actuator 304 on the reservoir 302 (and thus on the cooling fluid therein) is variable. The variable load applied by the actuator 304 may be based on sensor inputs. For instance, in some embodiments, with reference to FIG. 6, the controller is in communication with a pressure sensor 325, a flow rate sensor 335 and a temperature sensor 345 disposed within the cooling loop 150 to receive respective sensor signals therefrom indicative of the pressure, the flow rate and the temperature of the cooling fluid in the cooling loop 150. The controller controls the load applied by the actuator 304 on the reservoir 302 based on one or more of these sensor inputs. In some cases, the variable load applied by the actuator 304 may be based on only one of the sensor signals of the sensors 325, 335, 345 in which case the other ones of the sensors 325, 335, 345 may be omitted.

The actuator 304 could alternatively be any one of a mechanical actuator, a pneumatic actuator and a hydraulic actuator. For instance, if the actuator 304 is implemented as a mechanical actuator (e.g., a spring-loaded actuator), a controller to control its actuation could be omitted. In other instances, the actuator 304 could be a pump.

Figure 8:
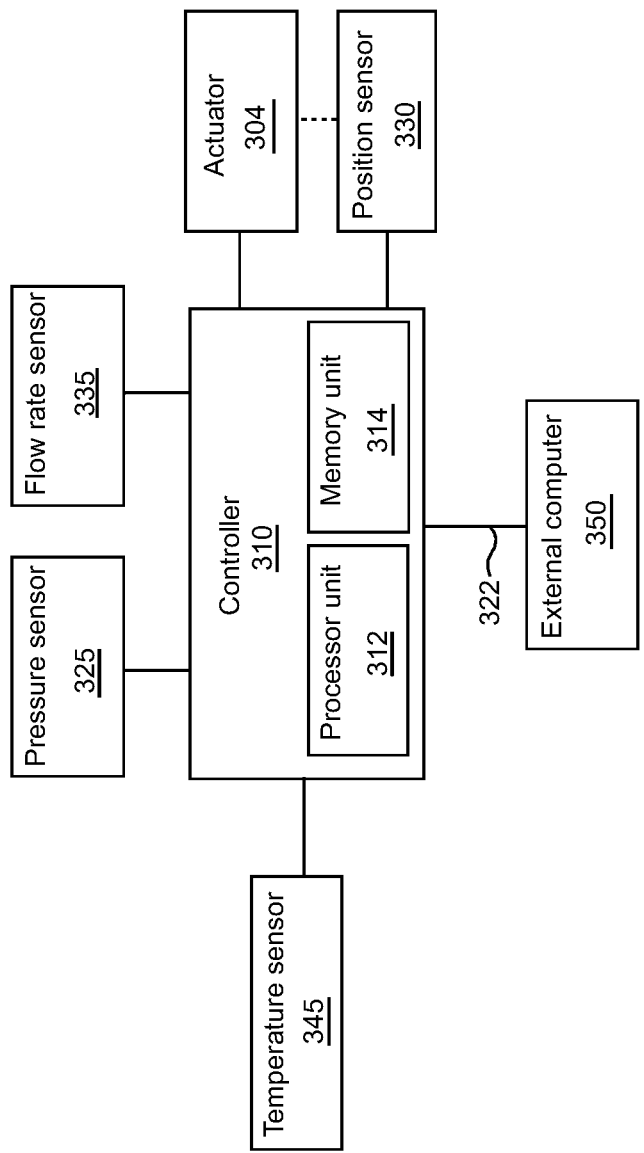
FIG. 8 is a block diagram representation of a control scheme of the fluid compensation system.

Furthermore, in this embodiment, as shown in FIG. 8, the fluid compensation system 300 also includes a sensor 330 and a controller 310 in communication with the sensor 330. The sensor 330 is configured to sense an operation parameter associated with the actuator 304 and is operable to transmit a sensor signal to the controller 310 indicative of the sensed operation parameter. More specifically, in this embodiment, the sensor 330 is a position sensor that senses a position of the actuator 304. For instance, the sensor 330 may sense the position of the end portion 311 of the actuator 304 or of the shaft 311 and transmit this information to the controller 310. In turn, the controller 310 processes the sensor signal transmitted thereto by the sensor 330 and can execute one or more actions based on the sensor signal. In particular, in this embodiment, based on the sensor signal, the controller 310 determines if the cooling loop 150 has lost cooling fluid and, if an important amount of cooling fluid has been lost from the cooling loop 150, the controller 310 can notify a user in order to take corrective action (e.g., perform maintenance of the rack assembly 100).

For instance, in this example, the controller 310 stores in its memory a table including a set of values of the position of the actuator 304 and corresponding volumes of the reservoir 302 associated therewith. For example, the controller 310 may associate a position P1 of the actuator 304 (illustrated in FIG. 7A) with the reservoir 302 being full (i.e., 100% of its volume is full). Similarly, the controller 310 may associate a position P2 of the actuator 304 (illustrated in FIG. 7B) with the reservoir 302 being half empty (i.e., 50% of its volume is full). The controller 310 may thus use this stored information to determine, based on the sensed position of the actuator 304, the current volume of the reservoir 302. Therefore, in use, the controller 310 compares the sensed position of the actuator 304 to a pre-determined threshold position value of the actuator 304 associated with a low volume of the reservoir 302. If the sensed position of the actuator 304 is lower than the pre-determined threshold position value of the actuator 304, the controller 310 transmits an alert signal that is an indication of a leak in the cooling loop 150.

In this embodiment, the alert signal is transmitted by the controller 310 to an external computer 350 (FIG. 8) that monitors a status of the cooling loop 150. For instance, the external computer 350 could be a computer device that is operable by an operator that is responsible for the operation of the rack assembly 100 or the data center in general. Notably, the external computer 350 is a computer within the data center in which the rack assembly 100 is located and is in communication with the controller 310 via a link 322. The link 322 is a wireless link in this example. In other cases, the link 322 may be a wired link. In some cases, the external computer 350 may even be a computer located remotely from the data center. In other examples, the external computer 350 may be a smartphone or other handheld computer device.

The controller 310 may be responsible for controlling other components associated with the fluid compensation system 300 and the rack assembly 100. For instance, as shown in FIG. 8, in this embodiment, the controller 310 is in communication with the actuator 304 to control actuation thereof. As such, in this embodiment, the controller 310 could also be in communication with the sensors 325, 335. In other embodiments, a separate controller could control the actuator 304. Moreover, the controller 310 may also be in communication with the bypass valve 224, the temperature sensor 225 and the isolating valves 185.

With reference to FIG. 8, the controller 310 has a processor unit 312 for carrying out executable code, and a non-transitory memory unit 314 that stores the executable code in a non-transitory medium (not shown) included in the memory unit 314. The processor unit 312 includes one or more processors for performing processing operations that implement functionality of the controller 310. The processor unit 312 may be a general-purpose processor or may be a specific-purpose processor comprising one or more preprogrammed hardware or firmware elements (e.g., application-specific integrated circuits (ASICs), electrically erasable programmable read-only memories (EEPROMs), etc.) or other related elements. The non-transitory medium of the memory unit 314 may be a semiconductor memory (e.g., read-only memory (ROM) and/or random-access memory (RAM)), a magnetic storage medium, an optical storage medium, and/or any other suitable type of memory. While the controller 310 is represented as being one control unit in this implementation, it is understood that the controller 310 could comprise separate control units for controlling components separately and that at least some of these control units could communicate with each other.

While the cooling loop 150 has been described as fluidly connecting the liquid cooling blocks 200 with the heat exchangers 165, it is contemplated that, in other embodiments, the liquid cooling blocks 200 and the heat exchangers 165 may be fluidly independent from one another (i.e., fluidly disconnected) but thermally connected to one another. As such, the cooling loop 150 could include a first portion, that includes the exchanger internal fluid conduits 170 of the heat exchangers 165, thermally connected to a second portion of the cooling loop 150 that includes the block internal fluid conduits 210 of the liquid cooling blocks 200. For example, a plate heat exchanger could be implemented to thermally connect the first and second portions of the cooling loop. Each of the portions of the cooling loop 150 has its own pump 220. In such embodiments, the reservoir 302 could be fluidly connected to one or both of the first and second portions of the cooling loop 150. Alternatively, an additional reservoir could be provided in a similar manner so that each of the first and second portions of the cooling loop 150 is fluidly connected to its own reservoir 302 to compensate for losses of cooling fluid in that portion of the cooling loop 150.

In some embodiments, the actuating device 304 may not necessarily be an actuator. For instance, with reference to FIG. 9, in an alternative embodiment, the fluid compensation system 300 has an actuating device 304' that forces cooling fluid from the reservoir 302 to the cooling loop 150 to compensate for loss of cooling fluid in the cooling loop 150. In particular, the actuating device 304' is a container 315 defining an internal space 309, and the reservoir 302 is disposed in the internal space 309, enclosed by the container 315. In this alternative embodiment, the internal space 309 of the container 315 is filled with pressurized air such that the pressurized air surrounds the reservoir 302 within the container 315. In this case, the actuating device 304' automatically forces cooling fluid from the reservoir 302 into the cooling loop 150 when there is a loss of cooling fluid within the cooling loop 150. Notably, when there is a loss of cooling fluid within the cooling loop 150 (e.g., a leak), the pressure within the cooling loop 150 decreases such that the pressure of the cooling fluid within the reservoir 302, which is compressed by a load applied thereon by the pressurized air within the container 315, becomes greater than that of the cooling loop 150. This forces the cooling fluid within the reservoir 302 to be discharged via the reservoir outlet 307 to the cooling loop 150, thereby compensating for the loss of cooling fluid in the cooling loop 150. In this example, the container 305 is pre-filled with pressurize air via an inlet 313 thereof.

Figure 9:
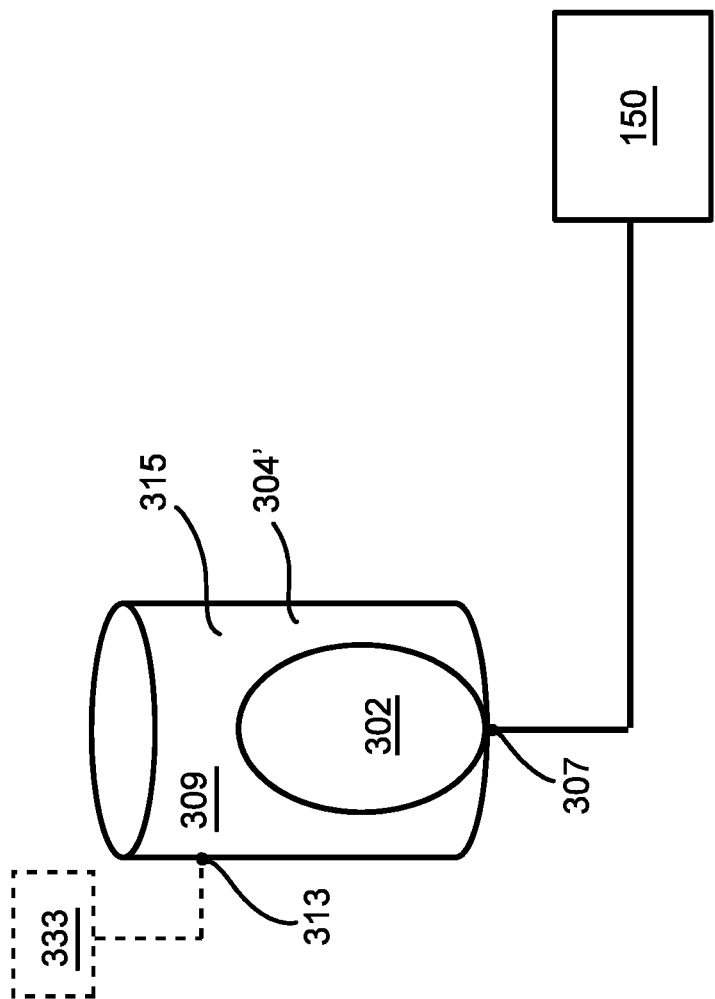
FIG. 9 is a schematic representation of an alternative embodiment of the fluid compensation system.

In an alternative configuration, as shown in FIG. 9, the container 305 may not be pre-filled and may instead be fluidly connected, via its inlet 313, to a compressor 333 which continuously fills the container 305 with compressed air.

As will be understood from the above, the fluid compensation system 300 allows for quick and easy detection of losses of cooling fluid in the cooling loop 150 and for compensation of these losses to ensure continued efficiency of the cooling of the electronic equipment 125 housed by the rack assembly 100. Moreover, the fluid compensation system 300 can autonomously alert an operator to an excessive loss of cooling fluid in the cooling loop 150 in order for the operator to take corrective action, such as maintenance of the rack assembly 100 (e.g., fixing leaks) and/or replacement of the reservoir 302.

It is contemplated that the rack assembly 100 and a method for controlling cooling fluid in the cooling loop 150 thereof in accordance with some non-limiting implementations of the present technology can be represented as presented in the following numbered clauses.

Modifications and improvements to the above-described implementations of the present technology may become apparent to those skilled in the art. The foregoing description is intended to be exemplary rather than limiting. The scope of the present technology is therefore intended to be limited solely by the scope of the appended claims.

What is claimed is:

1. A rack assembly for a data center, comprising:
   a rack frame defining at least one housing section and configured to house electronic equipment including at least one heat-generating component;
   a heat exchanger connected to the rack frame, the heat exchanger defining a first internal fluid conduit;
   at least one liquid cooling block connected to the at least one heat-generating component, each of the at least one liquid cooling block defining a second internal fluid conduit, the second internal fluid conduit being in thermal connection with the first internal fluid conduit of the heat exchanger;
   a cooling loop for circulating cooling fluid therein, the cooling loop comprising the first and second internal fluid conduits, the cooling loop being configured to transfer heat from the second internal fluid conduit to the first internal fluid conduit; and
   a fluid compensation system comprising:
      a reservoir fluidly connected to the cooling loop, the reservoir being configured to contain cooling fluid therein;
      an actuator configured to force cooling fluid from the reservoir to the cooling loop to compensate for loss of cooling fluid in the cooling loop;
      a position sensor configured to sense a position of the actuator; and
      a controller configured to receive the position of the actuator from the position sensor and transmit, based on the position of the actuator, an alert signal indicating a leak in the cooling loop.

2. The rack assembly of claim 1, wherein the cooling loop fluidly connects the first internal fluid conduit to the second internal fluid conduit.

3. The rack assembly of claim 1, wherein the heat exchanger comprises:
   a cooling coil defining the first internal fluid conduit; and
   a plurality of fins connected to the cooling coil, the plurality of fins being positioned to allow air flow therebetween.

4. The rack assembly of claim 1, wherein:
   the actuator is one of a mechanical actuator, an electric actuator, a pneumatic actuator and a hydraulic actuator.

5. The rack assembly of claim 4, wherein the controller is in communication with the actuator to control actuation thereof, and wherein the controller is configured to control a load applied by the actuator on the cooling fluid in the reservoir.

6. The rack assembly of claim 5, wherein the controller controls the actuator such that the load applied by the actuator on the cooling fluid in the reservoir is constant.

7. The rack assembly of claim 5, wherein:
   the fluid compensation system further comprises at least one of a flow rate sensor, a pressure sensor and a temperature sensor configured to sense, respectively, a flow rate, a pressure, and a temperature of the cooling fluid in the cooling loop;
   the controller is in communication with the at least one of the flow rate sensor, the pressure sensor and the temperature sensor to receive a sensor signal therefrom; and
   the controller controls the load applied by the actuator on the cooling fluid in the reservoir based on the sensor signal.

8. The rack assembly of claim 1, wherein the alert signal is configured to be transmitted to a computer that monitors a status of the cooling loop of the rack assembly.

9. The rack assembly of claim 1, wherein a volume of the reservoir is greater than a volume of the cooling loop.

10. The rack assembly of claim 1, wherein:
    the reservoir is a flexible reservoir; and
    the actuator is configured to apply a load on the flexible reservoir in order to force cooling fluid from the flexible reservoir to the cooling loop.

11. The rack assembly of claim 1, wherein the reservoir is replaceable with a replacement reservoir when the reservoir is empty.

12. The rack assembly of claim 1, wherein the cooling loop comprises a bypass valve that is controllable to selectively allow cooling fluid in the cooling loop to bypass the first internal fluid conduit of the heat exchanger.

13. The rack assembly of claim 1, wherein the cooling loop is independent from any sources of cooling fluid external to the rack assembly.

14. A method for controlling cooling fluid in a cooling loop of a rack assembly for a data center, the rack assembly comprising a heat exchanger connected to a rack frame of the rack assembly and at least one liquid cooling block, the heat exchanger comprising a first internal fluid conduit, the at least one liquid cooling block being connected to at least one heat-generating component housed within the rack frame, each of the at least one liquid cooling block defining a second internal fluid conduit, the cooling loop comprising the first internal fluid conduit of the heat exchanger and the second internal fluid conduit of each of the at least one liquid cooling block,
    the method comprising:
       fluidly connecting a reservoir to the cooling loop, the reservoir containing cooling fluid therein;
       forcing, by an actuator, cooling fluid from the reservoir to the cooling loop to compensate for loss of cooling fluid in the cooling loop;
       determining, by a position sensor, a position of the actuator;
       receiving, by a controller, the position of the actuator; and
       transmitting, based on the position of the actuator, an alert signal indicating a leak in the cooling loop.

15. The method of claim 14, wherein transmitting the alert signal further comprises:
    comparing the position of the actuator to a pre-determined threshold value; and
    based on said comparing, transmitting the alert signal indicating the leak in the cooling loop.

16. The method of claim 14, further comprising controlling a load applied on the reservoir by the actuator such that the load is constant.

17. The method of claim 14, further comprising:
in response to the reservoir being empty, replacing the reservoir with a replacement reservoir that contains cooling fluid.

18. The method of claim 14, wherein the cooling loop is independent from any sources of cooling fluid external to the rack assembly.

* * * * *